(12) United States Patent
Calvo Alonso et al.

(10) Patent No.: US 11,276,989 B2
(45) Date of Patent: Mar. 15, 2022

(54) SEMICONDUCTOR DEVICE AND MANUFACTURING METHOD

(71) Applicant: Comptek Solutions Oy, Turku (FI)

(72) Inventors: Vicente Calvo Alonso, Piispanristi (FI); Johnny Dahl, Turku (FI); Jouko Lang, Lieto (FI)

(73) Assignee: Comptek Solutions Oy, Turku (FI)

( * ) Notice: Subject to any disclaimer, the term of this patent is extended or adjusted under 35 U.S.C. 154(b) by 173 days.

(21) Appl. No.: 16/634,614

(22) PCT Filed: Jul. 27, 2018

(86) PCT No.: PCT/FI2018/050558
§ 371 (c)(1),
(2) Date: Jan. 28, 2020

(87) PCT Pub. No.: WO2019/020871
PCT Pub. Date: Jan. 31, 2019

(65) Prior Publication Data
US 2020/0274332 A1    Aug. 27, 2020

(30) Foreign Application Priority Data
Jul. 28, 2017   (GB) .................................... 1712147

(51) Int. Cl.
*H01L 21/02* (2006.01)
*H01L 31/0352* (2006.01)
(Continued)

(52) U.S. Cl.
CPC .... *H01S 5/34333* (2013.01); *H01L 21/02483* (2013.01); *H01L 21/02565* (2013.01);
(Continued)

(58) Field of Classification Search
CPC ......... H01L 21/02483; H01L 21/02565; H01L 21/02609; H01L 31/035236;
(Continued)

(56) References Cited

U.S. PATENT DOCUMENTS 5,909,614 A   6/1999 Krivoshlykov
5,965,908 A  10/1999 Shibata et al.
(Continued)

FOREIGN PATENT DOCUMENTS

DE  102015117874 A1  4/2017
JP     H09320967 A  12/1997
WO    2012062966 A1   5/2012

OTHER PUBLICATIONS

Punkkinen et al., "Oxidized In-containing III-V (100) Surfaces: Formation of Crystalline Oxide Films and Semiconductor-oxide Interfaces," Physical Review B 83, 195329 (2011).
(Continued)

*Primary Examiner* — David Vu
*Assistant Examiner* — Brandon C Fox
(74) *Attorney, Agent, or Firm* — James C. Lydon

(57) ABSTRACT

The present disclosure is related to a semiconductor device and a method of manufacturing the said semiconductor device. The semiconductor device comprising a stacked configuration of a plurality of semiconductor layers. At least one of the semiconductor layers is a III-V compound semiconductor layer, and at least one of the III-V compound semiconductor layers has formed thereonto a corresponding crystalline terminating oxide layer, wherein the at least one of the plurality of semiconductor layers interfaces via its crystalline terminating oxide layer to a neighbouring epitaxial semiconductor layer thereto. The semiconductor device is a quantum well device.

15 Claims, 11 Drawing Sheets

(51) Int. Cl.
*H01L 33/00* (2010.01)
*H01S 5/343* (2006.01)
*H01L 33/02* (2010.01)
*H01L 33/06* (2010.01)
*H01S 5/34* (2006.01)

(52) U.S. Cl.
CPC ............... *H01L 21/02609* (2013.01); *H01L 31/035236* (2013.01); *H01L 33/0062* (2013.01); *H01L 33/025* (2013.01); *H01L 33/06* (2013.01); *H01S 5/3407* (2013.01)

(58) Field of Classification Search
CPC ... H01L 33/0062; H01L 33/025; H01L 33/06; H01S 5/34333; H01S 5/3407
USPC .................................................. 257/97, 13
See application file for complete search history.

(56) References Cited

U.S. PATENT DOCUMENTS

| | | | |
|---|---|---|---|
| 9,269,763 B2 | 2/2016 | Laukkanen et al. | |
| 9,837,486 B2 | 12/2017 | Laukkanen et al. | |
| 10,141,477 B1* | 11/2018 | Bhusal | H01L 33/02 |
| 10,256,290 B2 | 4/2019 | Laukkanen et al. | |
| 2010/0288998 A1* | 11/2010 | Kikuchi | H01L 33/06 257/13 |
| 2012/0061728 A1 | 3/2012 | Javey et al. | |
| 2012/0234117 A1* | 9/2012 | Oswald | E21B 33/0355 74/89.39 |
| 2013/0214331 A1* | 8/2013 | Laukkanen | H01L 29/02 257/200 |
| 2014/0353771 A1 | 12/2014 | Wang et al. | |
| 2015/0060873 A1 | 3/2015 | Chiu et al. | |
| 2016/0351698 A1 | 12/2016 | Yang | |
| 2017/0104083 A1 | 4/2017 | Chiu et al. | |
| 2018/0053859 A1* | 2/2018 | Wang | H01L 21/02172 |
| 2018/0218901 A1 | 8/2018 | Kuzmin et al. | |

OTHER PUBLICATIONS

Qin et al., "A Crystalline Oxide Passivation for Al2O3/AlGaN/GaN," Applied Physics Letters, 105, 141604 (2014).

* cited by examiner

SEMICONDUCTOR DEVICE AND MANUFACTURING METHOD

TECHNICAL FIELD

The present disclosure relates generally to semiconductor devices; more specifically to heterostructure semiconductor devices that are epitaxially fabricated from III-V semiconductors. Moreover, the present disclosure concerns methods of manufacturing aforesaid semiconductor devices. Furthermore, the present disclosure is concerned with computer program products comprising a non-transitory computer-readable storage medium having computer-readable instructions stored thereon, the computer-readable instructions being executable by a computerized device comprising processing hardware to execute aforesaid methods.

BACKGROUND

Semiconductor quantum well structures, for example compound semiconductor quantum well structures, are well known structures and are contemporarily used in optoelectronic devices, such as lasers and light emitting diodes, detectors or photovoltaic devices, e.g. solar cells. These optoelectronic devices that comprise quantum well structures are inherently heterostructure devices which provide quantum well interfaces (i.e., layers or regions) between two different crystalline semiconductors. A quantum well is a thin layer which can confine quasi-particles (typically electrons or holes) in the dimension perpendicular to the layer surface, whereas the movement in the other dimensions is not restricted, and is often realized with a thin layer of a semiconductor medium, embedded between other semiconductor layers of wider bandgap, for example, GaAs quantum well embedded in AlGaAs, or InGaAs in GaAs.

III-V semiconductor devices are especially useful for manufacturing optoelectronic devices, such as LED's, LASERS, Mach-Zehnder optical modulators and the like. Furthermore, III-V compound semiconductors are obtained by combining group III elements (essentially Al, Ga, In) with group V elements (essentially N, P, As, Sb). In such devices, a given semiconductor material is grown epitaxially as a layer on top of another given semiconductor material, thereby generating a heterostructure. Moreover, by using epitaxial-growth fabrication techniques, III-V semiconductors can be fabricated into quantum wells and similar stacked structures, for example for implementing LASER structures. Furthermore, quantum wells are formed in semiconductors by having a material, such as indium gallium nitride, sandwiched between two layers of a material with a wider bandgap, for example gallium nitride. Other possible examples of material combination may include layer of gallium arsenide sandwiched between two layers of aluminium gallium arsenide, and the like. These structures can be grown by processes like, molecular beam epitaxy or chemical vapour deposition.

In aforementioned quantum heterostructures, where the material composition is spatially altered in a layered heterostructure stack (e.g. GaN—InGaN—GaN, GaAs—GaInAs—GaAs), the electronic valence and conduction band characteristics also change spatially along the heterostructure stack creating band discontinuities at interfaces between layers of semiconductor materials employed. From an application perspective, such quantum wells in a given semiconductor optoelectronic device usually act as an active layer. Specifically, photon generation occurs in operation when charge carriers confined between potential energy barriers induced by band discontinuities, recombine to generate a photon. The photon has a wavelength that depends upon the energy difference between the quantum wells corresponding conduction band minimum and valence band maximum.

In general, in optoelectronic devices, especially in light emitting devices, there is a requirement for a high current injection into active quantum well regions of the optoelectronic devices. However, it is known that LED device efficiency significantly drops as operating current density increases in LED devices. This drop is referred to as being "efficiency droop". The efficiency droop is thought to be caused by the several factors: (i) Shockley-Read-Hall recombination of electrons/holes; (ii) Auger recombination; and (iii) electron overflow from the quantum well.

Notably, in the electron overflow, there arise conduction mechanisms wherein electrons are lost from a given active layer to one or more non-radiative recombination centres, thereby reducing light generation and output. Moreover, this recombination process generates excess heat which reduces an operating lifetime of a given optoelectronic device. The inherent reason behind aforementioned electron overflow is an insufficient potential barrier height in a given active quantum well (QW) structures, namely a band offset between a given quantum well material and a corresponding neighbouring barrier material. An additional problem that is encountered is a technical challenge to grow layers epitaxially on top of conventional oxide layers that tend to be amorphous in nature and therefore not effective at seeding monocrystalline epitaxial growth of layers thereupon during device manufacture.

Contemporarily known semiconductor production facilities address aforementioned problems, when fabricating optoelectronic device, by employing some known techniques. One such technique is to fabricate optoelectronic devices as epitaxially-grown heterostructures wherein there are employed relatively thick barriers and electron blocking layers, and thus prevent electrons overflowing out of the active region. Another technique employed to fabricate optoelectronic devices is by inserting thin large-band-gap materials as a thin barrier layer, for example as in AlInN on InGaN—GaN quantum well LEDs. One another technique employed for fabricating optoelectronic devices is by inserting multi-quantum barrier layers to increase an effective barrier height between a given well and a given barrier neighbouring thereto. However, some of these approaches for fabricating optoelectronic device are subject to undesired positive polarization charges which can pull down the conduction band near the interface and thus make the electron blocking layers less efficient. Meanwhile, positive charges attract parasitic electrons, which cannot contribute to the desired light-emission but are irretrievably lost to heat.

Document US 2017/263,729 discloses a high electron mobility transistor (HEMT) and a method of forming the same. The HEMT includes a first III-V compound layer having a first band gap and a second III-V compound layer having a second band gap over the first III-V compound layer, wherein the second band gap is greater than the first band gap. The HEMT further includes a first oxide layer over the second III-V compound layer; a first interfacial layer over the first oxide layer; and a passivation layer over the first interfacial layer.

Therefore, in light of the foregoing discussion, there exists a need to overcome the aforementioned drawbacks associated with conventional semiconductor devices and conventional manufacturing techniques.

SUMMARY OF THE INVENTION

The present disclosure seeks to provide a semiconductor device. The present disclosure also seeks to provide a method of fabricating a semiconductor device. The present disclosure seeks to provide a solution to the existing problem of amorphous oxide layers and electron overflow in semiconductor devices. An aim of the present disclosure is to provide a solution that overcomes at least partially the problems encountered in prior art, and provides an economical, easy to implement, sophisticated semiconductor device comprising crystalline terminating oxide layers for epitaxial growth of highly ordered semiconductor layers thereon.

In one aspect, an embodiment of the present disclosure provides a semiconductor device comprising a stacked configuration of a plurality of semiconductor layers, wherein
- at least one of the semiconductor layers is a III-V compound semiconductor layer;
- at least one of the III-V compound semiconductor layers has formed thereonto a corresponding crystalline terminating oxide layer, wherein the at least one of the plurality of semiconductor layers interfaces via its crystalline terminating oxide layer to a neighbouring epitaxial semiconductor layer thereto; and
- the semiconductor device is arranged to be a quantum well device.

In another aspect, an embodiment of the present disclosure provides a method of fabricating a semiconductor quantum well device comprising a stacked configuration of a plurality of semiconductor layers, wherein at least one of the semiconductor layers is a III-V compound semiconductor layer and the plurality of semiconductor layers are operable to accommodate charge carriers, characterized in that the method comprises:
- forming onto the at least one III-V compound semiconductor layer a corresponding crystalline terminating oxide layer by absorption of oxygen atoms; and
- forming a semiconductor layer directly above the formed crystalline terminating oxide layer.

In yet another aspect, embodiments of the present disclosure provide a computer program product comprising a non-transitory (namely non-transient) computer-readable storage medium having computer-readable instructions stored thereon, the computer-readable instructions being executable by a computerized device comprising processing hardware to execute the aforementioned method of fabricating a semiconductor device.

Embodiments of the present disclosure substantially eliminate or at least partially address the aforementioned problems in the prior art, and enables growth of thin, highly ordered crystalline terminating oxide layers for epitaxial growth of crystalline semiconductor layers thereon.

Additional aspects, advantages, features and objects of the present disclosure would be made apparent from the drawings and the detailed description of the illustrative embodiments construed in conjunction with the appended claims that follow.

It will be appreciated that features of the present disclosure are susceptible to being combined in various combinations without departing from the scope of the present disclosure as defined by the appended claims.

BRIEF DESCRIPTION OF THE DRAWINGS

The summary above, as well as the following detailed description of illustrative embodiments, is better understood when read in conjunction with the appended drawings. For the purpose of illustrating the present disclosure, exemplary constructions of the disclosure are shown in the drawings. However, the present disclosure is not limited to specific methods and apparatus disclosed herein. Moreover, those in the art will understand that the drawings are not to scale. Wherever possible, like elements have been indicated by identical numbers.

Embodiments of the present disclosure will now be described, by way of example only, with reference to the following diagrams wherein.

Figure 1:
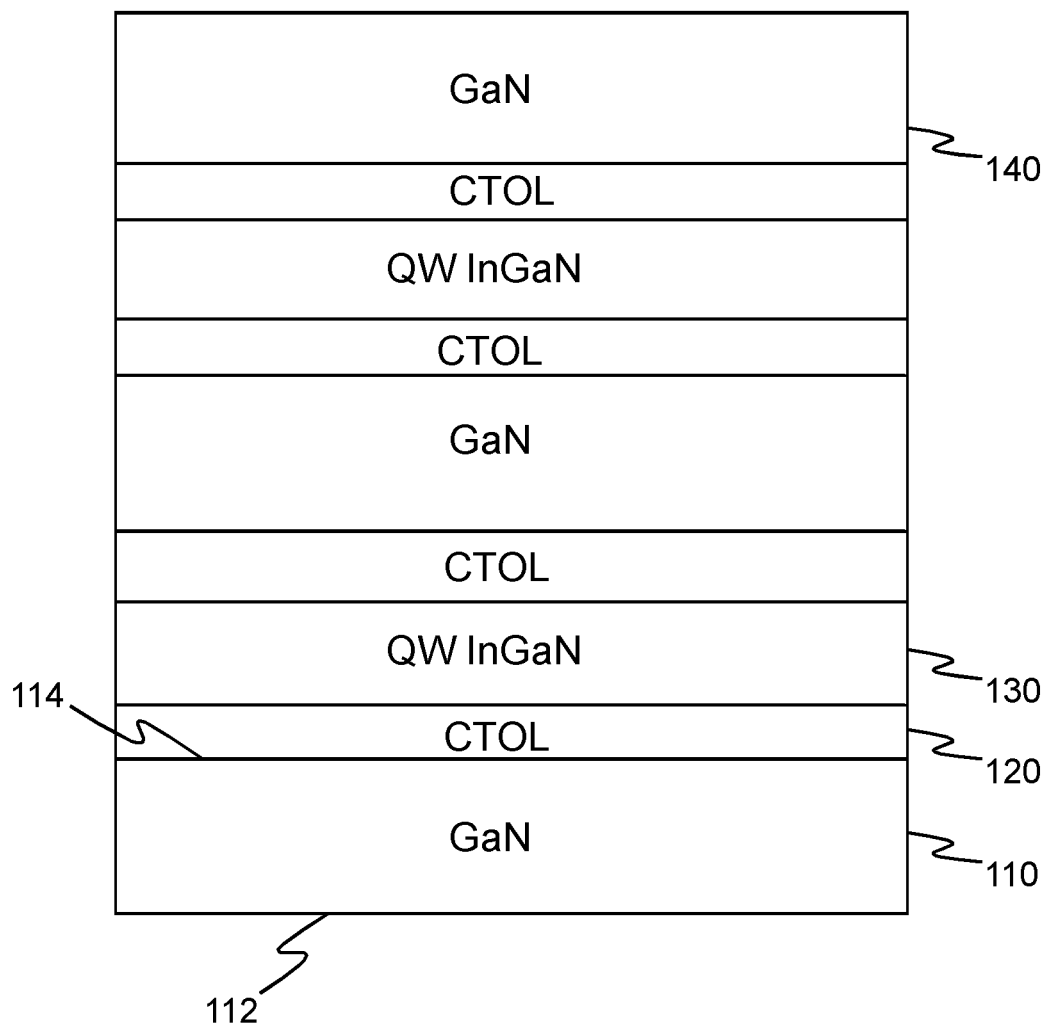
FIG. 1 is a schematic illustration of a semiconductor device having a crystalline terminating oxide layer therein, in accordance with an embodiment of the present disclosure.

In the accompanying diagrams, an underlined number is employed to represent an item over which the underlined number is positioned or an item to which the underlined number is adjacent. A non-underlined number relates to an item identified by a line linking the non-underlined number to the item.

DETAILED DESCRIPTION OF EMBODIMENTS

The following detailed description illustrates embodiments of the present disclosure and ways in which they can be implemented. Although some modes of carrying out the present disclosure have been disclosed, those skilled in the art would recognize that other embodiments for carrying out or practicing the present disclosure are also possible.

In one aspect, an embodiment of the present disclosure provides a semiconductor device comprising a stacked configuration of a plurality of semiconductor layers, wherein
- at least one of the semiconductor layers is a III-V compound semiconductor layer;
- at least one of the III-V compound semiconductor layers has formed thereonto a corresponding crystalline terminating oxide layer, wherein the at least one of the plurality of semiconductor layers interfaces via its crystalline terminating oxide layer to a neighbouring epitaxial semiconductor layer thereto; and the semiconductor device is arranged to be a quantum well device.

In the semiconductor device, the plurality of semiconductor layers are operable to accommodate charge carriers. Additionally, the crystalline terminating oxide layer is operable to support growth of the neighbouring epitaxial semiconductor layer during manufacture of the semiconductor device. Furthermore, the crystalline terminating oxide layer is operable to increase an energy barrier for the semiconductor device for improving carrier confinement within the stacked configuration of the plurality of semiconductor layers.

In another aspect, an embodiment of the present disclosure provides a method of fabricating a semiconductor quantum well device comprising a stacked configuration of a plurality of semiconductor layers, wherein at least one of the semiconductor layers is a III-V compound semiconductor layer and the plurality of semiconductor layers are operable to accommodate charge carriers, characterized in that the method comprises:

forming onto the at least one III-V compound semiconductor layer a corresponding crystalline terminating oxide layer by absorption of oxygen atoms; and forming a semiconductor layer directly above the formed crystalline terminating oxide layer.

The present disclosure provides a semiconductor device and a method of fabricating the semiconductor device. The semiconductor device comprises crystalline oxide structures formed on compound semiconductor materials that exhibit excellent properties regarding providing layers onto which subsequent crystalline epitaxial layers can be fabricated, and are synergistically capable of defining energy barriers in stacks of semiconductor layers for achieving improved electron confinement. Furthermore, the semiconductor device, with the crystalline terminating oxide layer and quantum well structure, in accordance with the present disclosure may be formed using epitaxial manufacturing techniques, e.g., growing by III-V semiconductor MOCVD/MBE epitaxy. Moreover, such thin, yet highly ordered, terminating oxide layers exhibit excellent uniformity with smooth surface structures which allows use thereof as templates for subsequent semiconductor epitaxy to be performed thereonto. Additionally, the crystalline compound semiconductor oxides, with the terminating oxide layer, provides a resulting energy band gap of a given layer that is drastically wider compared to a host semiconductor material, thereby making these structures highly promising to be used as a high quality barrier layer. The semiconductor devices of the present disclosure with crystalline terminating oxide layers acting as barrier layers may be incorporated into various devices and be used in a conventional manner. For example, the semiconductor devices of the present disclosure may be employed in various types of optoelectronic devices including amplifiers, light emitting diodes and edge emitting and surface emitting lasers that incorporate optical feedback to provide lasing action, and may have application in solid state lighting, solid state displays, lasers, light emitting diodes (LEDs), biomedical therapy and diagnostic devices, medical lasers, eye surgery devices and DVD lasers.

The present invention thus differs from that disclosed in US 2017/263,729. Indeed, said document presents an interesting utilization of crystalline oxide layers for high-electron mobility transistors. However, the document does not consider the utility of the larger band gap of the crystalline oxide layer for the confinement of charge carriers in quantum well devices. The document also only presents structures where the formation of crystalline oxide layer is limited to one material layer in the device. The present disclosure uses a crystalline terminating oxide layer to improve charge carrier confinement. According to an embodiment, the semiconductor device comprises two crystalline terminating oxide layers, and thus charge carriers in III-V compound semiconductor layers can be confined between two crystalline terminating oxide layers.

The semiconductor device is arranged to be a quantum well (QW) device. A quantum well structure contains a semiconductor material layer sandwiched between two semiconductor layers with a wider bandgap. Typical examples are a GaAs layer between two AlGaAs layers, and an InGaN layer between two GaN layers. Quantum well structures can be manufactured with methods known in the art, including but not limited to, molecular beam epitaxy (MBE) and metalorganic chemical vapor deposition (MOCVD).

Moreover, the semiconductor device can be implemented as at least one of: a laser diode device stack, a semiconductor light emitting diode (LED) stack, a semiconductor photodetector stack, a semiconductor solar cell stack. Furthermore, the crystalline terminating oxide layer may alternatively or also be implemented as a buried layer within the semiconductor device. Additionally, in the semiconductor device, the plurality of semiconductor layers can be fabricated from III-V compound semiconductors, while at least one of the semiconductor layer are III-V compound semiconductor layers. Moreover, the crystalline terminating oxide layer can be fabricated concurrently with fabrication of the neighbouring epitaxial semiconductor layer. Alternatively, the crystalline terminating oxide layer may be fabricated prior to fabrication of the neighbouring epitaxial semiconductor layer. Optionally, the crystalline terminating oxide layer comprises hydrogen. More optionally, the crystalline terminating oxide layer comprises nitrogen.

According to an embodiment, opposite sides of the quantum well comprise a corresponding crystalline terminating oxide layer, i.e. there are further corresponding crystalline terminating oxide layer to those mentioned above. By opposite sides are meant the sides of the device that have the largest surface area.

The aforementioned method also comprises arranging for the semiconductor device to be a quantum well (QW) device. Moreover, the method can further comprise implementing the semiconductor device as at least one of: a laser diode device stack, a semiconductor light emitting diode (LED) stack, a semiconductor photodetector stack, a semiconductor solar cell stack. Furthermore, the method may comprise implementing the crystalline terminating oxide layer as a buried layer within the semiconductor device. Additionally, the method may also comprise fabricating the plurality of semiconductor layers from III-V compound semiconductors, i.e. one, two, three, four, five, six, seven or even more of III-V compound semiconductor layers can be fabricated. In the aforesaid method, the crystalline terminating oxide layer can be fabricated concurrently with fabrication of the neighbouring epitaxial semiconductor layer, or alternatively, the crystalline terminating oxide layer is fabricated prior to fabrication of the neighbouring epitaxial semiconductor layer. Furthermore, the crystalline terminating oxide layer can comprise hydrogen. Optionally, the crystalline terminating oxide layer can comprise nitrogen.

According to yet another embodiment, the crystalline terminating oxide layer is a crystalline compound semiconductor oxide layer. In an embodiment, Indium atoms are deposited onto the first semiconductor layer prior to transforming the surface to a crystalline terminating oxide layer. In another embodiment, tin atoms are deposited onto the first semiconductor layer prior to transforming the surface to a crystalline terminating oxide layer. In yet a further embodiment both indium and tin atoms are deposited onto the first semiconductor layer prior to transforming the surface to a crystalline terminating oxide layer.

In yet another aspect, the present disclosure provides a computer program product comprising a non-transitory (namely non-transient) computer-readable storage medium having computer-readable instructions stored thereon, the computer-readable instructions being executable by a computerized device comprising processing hardware to execute the aforementioned method of fabricating the semiconductor device.

The present disclosure relates to compound semiconductor quantum well structures. In overview, embodiments of the present disclosure pertain to a heterostructure device employing a stack of material layers. The heterostructure device, herein, refers to any device with layers or regions of dissimilar crystalline semiconductors, such that these semiconducting materials have unequal band gaps. Such device may be fabricated, for example using epitaxial processes. Embodiments of the present disclosure concern novel types of epitaxial semiconductor heterostructures facilitating semiconductor regrowth, wherein the semiconductor regrowth contain, includes, namely crystalline terminating oxide layers as buried structures. In the present disclosure, the terms "terminating oxide layer" have been used in place of "crystalline terminating oxide layer", without any limitations.

In an embodiment, known epitaxial growth methods used to manufacture the heterostructures include, but are not limited to, metalorganic chemical vapour deposition (MOCVD) and molecular beam epitaxy (MBE), and by performing oxidation either simultaneously with the epitaxial growth, or alternating epitaxial growth and oxidation of the surface to transform the surface into a crystalline semiconductor oxide. Such techniques for manufacturing semiconductor devices are well known in the art, and have not been described herein in detail for the brevity of the present disclosure. By performing such epitaxial growth and oxidation simultaneously, it is feasible to create a thicker layer of crystalline terminating oxide layer than what is achievable by merely utilizing oxidation of an epitaxial semiconductor surface. In such embodiments, there is provided a benefit of the creation of oxygen containing epitaxial structures which are resistant to further oxygen exposure, and on which it is possible to grow epitaxial material. The embodiments are suitable, for example, for optoelectronic and photovoltaic applications comprising quantum well (QW) semiconductor material structures.

The semiconductor device comprises a stacked configuration of a plurality of semiconductor layers, such that the plurality of semiconductor layers are operable to accommodate charge carriers. In an embodiment, the stack of material layers comprises at least one crystalline terminating oxide layer as a buried barrier layer. According to an embodiment, such crystalline terminating oxide layer may be manufactured by employing an oxygen flux in vacuum conditions. The aforementioned crystalline terminating oxide layer is fabricated by administering oxygen (as gaseous form, as $O_2$ or $O_3$, or for example with $H_2O_2$ being present) to a heated surface of a crystalline semiconductor substrate material. When the oxygen dose and surface temperature are selected correctly, the oxygen is absorbed into the surface and causes the transformation of the surface structure while retaining the crystalline nature of the surface.

Typically, only oxygen is used as a reagent, as compared to the more traditional oxide layer formation processes which typically involves using more than one element reaction and where new oxide material is grown onto the surface instead of transforming the existing surface. An example of such more traditional method of creating crystalline oxides on semiconductors is the deposition of rare earth oxides onto semiconductors.

According to an embodiment, corresponding crystalline terminating oxide layers can be made with methods known in the art. One such method is disclosed by Dong et al., published in J. Vac. Sci. Technol. B 24, 2080 (2006), Qin et al., Applied Physics Letters 105, 141604 (2014) and the publication WO 2012/062966. Indeed, the temperature and oxygen dose can be for example 550° C. and 200 000 Langmuir. This transformation typically results in the change of the surface symmetry, but sometimes the surface symmetry stays the same.

According to yet another embodiment, the at least one of the plurality of semiconductor layer interfaces via its crystalline terminating oxide layer to a neighbouring epitaxial semiconductor layer thereto. The term "epitaxy" described herein, refers to the deposition of a crystalline overlayer on a crystalline substrate. Epitaxial films may be grown from gaseous or liquid precursors. Herein, the corresponding crystalline terminating oxide layer acts as a seed crystal, the deposited semiconductor may lock into one or more crystallographic orientations with respect to the substrate. Furthermore, the crystalline terminating oxide layer is formed by transformation of the substrate semiconductor material surface.

The crystal symmetry of the crystalline terminating oxide can be the same or can differ from the crystal structure of the III-V semiconductor material. Some III-V materials have more than one possibility for a crystalline terminating oxide structure. The different structures can be achieved by doing the transformation of the III-V semiconductor surface in different temperature, oxygen dose, oxygen flux, partial pressure of oxygen, and/or duration of the treatment. It can be said that each III-V material has a set of corresponding crystalline terminating oxide layers, thus the use of the term "corresponding".

In an embodiment where the III-V material is InAs, the corresponding crystalline terminating oxide layers can be at least such crystalline terminating oxide layers which have a surface symmetry of c(4×2) and (3×1). In an embodiment where the III-V material is InGaAs, the corresponding crystalline terminating oxide layers can be at least such crystalline terminating oxide layers which have a surface symmetry of c(4×2), (4×3), (3×1) and (3×2). In an embodiment where the III-V material is InP, the corresponding crystalline terminating oxide layers can be at least such crystalline terminating oxide layers which have a surface symmetry of (2×3). Further possible III-V materials and their corresponding crystalline terminating oxide layer (given in parentheses) are for example GaN (3√3×3√3–R30°), AlGaN (1×1), InSb (1×2), InGaSb (1×2), InAs (3×3), InGaAs (3×3), InP (1×1) and InGaP (1×1).

According to an embodiment, the method comprises further forming a third corresponding crystalline terminating oxide layer onto a III-V compound semiconductor layer, which III-V compound semiconductor layer has been formed on a previously formed crystalline terminating oxide layer. There are several options to make this. Indeed, when taking the basic structure of a III-V compound semiconductor layer, (first) 1o crystalline terminating oxide layer and a semiconductor layer, if the latter semiconductor layer is also made of III-V compound, then the second crystalline terminating oxide layer may be formed on this III-V compound layer. Alternatively, if in the basic structure the semiconductor layer is not a III-V compound semiconductor layer, there are further layers such that there is a crystalline terminating oxide layer, a III-V compound layer thereon, and said second crystalline terminating oxide layer on the III-V compound layer. In an embodiment of the present disclosure, the crystalline terminating oxide layer is formed in an oxidation process. In an example, an external surface of a first semiconductor is heated to a temperature of at least 200° C. and up to 550° C. for supporting the oxidation process. The temperature is selected depending upon a material composition of the external surface. The reaction takes place in vacuum conditions, with the chamber background pressure typically in range of $1\times10^{-11}$ to $1\times10^{-7}$ mBar. Subsequently, the external surface is exposed to a flux of oxygen atoms at the selected temperature. In an embodiment, the oxygen flux is selected to be low enough such that oxygen atoms of the oxygen flux can adsorb and diffuse into the first semiconductor material without creating an amorphous surface structure on the external surface. The aforementioned relatively low oxygen flux is achieved in practice, for example, by having an oxygen gas partial pressure of less than $1\times10^{-8}$ to $1\times10^{-2}$ mBar in a vacuum chamber, which is comparatively much lower than pressure used in traditional growth process which varies between 10-2 mBar to 1 Bar. Furthermore, the oxidation time may vary between seconds to 60 minutes. In such an instance, the diffused oxygen atoms of the oxygen flux can form a terminating oxide layer which is crystalline in nature on the aforesaid external surface, such as the crystalline terminating oxide layer on the semiconductor substrate of the present disclosure.

It will be appreciated that a correct dose and flux of oxygen is required to be employed when implementing embodiments of the present disclosure. The oxygen dose and flux is dependent on size and material of the semiconductor substrate. It will be further appreciated that a too high dose of oxygen atoms will create an amorphous surface structure on the external surface. Similarly, a too high flux will create an amorphous surface structure on the external surface. In one example, the oxygen flux employed for fabrication of the present crystalline terminating oxide layer is less than 100000 Langmuir, where Langmuir is a unit of exposure (or dosage) to a surface (e.g. of a crystal) to measure the adsorption of gases. In such an instance, the crystalline terminating oxide layer can have thickness of 2 nm or less. Optionally, in embodiments of the present disclosure, it is feasible to form a thicker terminating oxide layer of more than 2 nm, by alternating epitaxial growth and oxidation, or by implementing epitaxial growth concurrently while implementing oxidation.

According to an embodiment, the semiconductor surface and/or the oxygen atoms is/are illuminated with UV light before, during and/or after the forming of the corresponding crystalline terminating oxide layer. In other words, forming of the corresponding crystalline terminating oxide layer comprises illuminating the first III-V compound semiconductor surface and/or the oxygen atoms with UV light. Most typically, illumination with UV light is used during the forming of the corresponding crystalline terminating oxide layer, but it may also be used before (typically immediately before) and/or after the forming of this layer. It is also possible to use UV light only before and during, only before and after or only during and after the forming. The UV light can thus be used immediately prior to the use of the oxygen, during use of the oxygen or immediately after the use of oxygen. Most typically, illumination with UV light is used during the forming of the corresponding crystalline terminating oxide layer, but it may also be used before (typically immediately before) and/or after the forming of this layer. It is also possible to use UV tight only before and during, only before and after or only during and after the forming. Similarly, the UV-light may be directed to the oxygen flow or to the surface to be treated, or both.

By utilizing ultraviolet (UV) light, it is possible to alter the parameter space where the corresponding crystalline terminating oxide layer can be formed, i.e. to modify the required temperature, time and/or dosage of oxygen needed. Typically, the formation of corresponding crystalline terminating oxide layer needs an elevated temperature. In some embodiments the required temperature for forming a corresponding crystalline terminating oxide layer can be lowered by irradiating the oxygen atoms and/or the III-V compound semiconductor with UV light prior, during and/or after the absorption of oxygen atoms onto the III-V compound semiconductor surface.

Indeed, without wishing to be bound by a theory, the inventors believe that the crystalline structure may, immediately upon forming, be a non-organised structure. Thereafter, with the effect of UV light, the crystalline structure is organised to the desired structure. A benefit of lowering the required temperature is that during manufacturing of a semiconductor device, increased temperature required for the formation of a layer may 30o have a negative effect on a previously formed layer. This negative effect can be avoided or at least minimised by the use of UV-light when it allows decreasing the processing temperature.

The luminosity of the UV light used may be 20 mW/cm²-1500 mW/cm². For example the luminosity can be from 20, 50, 100, 150, 200, 250, 300, 350, 400, 450, 500, 550, 600, 650, 700, 750, 800, 850, 900, 1000, 1050, 1100, 1150, 1200, 1250 or 1300 mW/cm² up to 50, 100, 150, 200, 250, 300, 350, 400, 450, 500, 550, 600, 650, 700, 750, 800, 850, 900, 950, 1000, 1050, 1100, 1150, 1200, 1250, 1300, 1350, 1400, 1450 or 1500 mW/cm². The duration of the use of UV light can be as long as the duration of the absorption of the oxygen atoms, or it may shorter or longer than this time period.

The UV light may be provided with any suitable light source, as is known in the art. The UV light may for example have a wavelength shorter than 315 nm, or shorter than 280 nm. The UV light may have a wavelength between 100 nm and 400 nm. Indeed, the wavelength may be from 100, 110, 130, 150, 170, 200, 215, 230, 250, 265, 280, 300, 315, 330, 350 or 360 nm up to 110, 130, 150, 170, 200, 215, 230, 250, 265, 280, 300, 315, 330, 350, 360, 380 or 400 nm.

The required conditions (wavelength, time, luminosity) may vary from one III-V compound to another. A person skilled in the art is readily able to find out suitable conditions, based on a few simple tests.

In one embodiment, the crystalline terminating oxide layer can be fabricated concurrently with fabrication of the neighbouring epitaxial semiconductor layer. Alternatively, the crystalline terminating oxide layer can be fabricated prior to fabrication of the neighbouring epitaxial semiconductor layer. Furthermore, when forming the terminating oxide layer, the employed oxygen distribution is varied spatially. Such a variation is optionally implemented as two or more different crystal phases, where each of the crystal phase or phases is monitored by employing a suitable instrument, such as low energy electron diffraction (LEED), reflection high energy electron diffraction (RHEED) or reflectance anisotropy spectroscopy (RAS). In some examples, the oxygen distribution in a vertical direction, relative to a plane of the aforesaid external surface, for fabrication of the terminating oxide layer, can be controlled, for example, by implementing epitaxial growth concurrently while performing surface oxidation and also whilst varying the aforementioned oxygen flux. The formed crystalline terminating oxide layer is uniform in its lateral dimensions relative to a plane of the aforesaid external surface of the semiconductor substrate.

In an embodiment, the crystalline terminating oxide layer has characteristics that it has a crystal structure, and a long range ordering of atoms. In practice, a first lattice structure at and close to surface of the first semiconductor layer transforms due to adsorbed oxygen atoms. Therefore, the formed crystalline terminating oxide layer contains oxygen and atoms of the III-V compound. Since the amount of oxygen atoms is within predetermined range and those are administered in a control manner, the oxygen atoms will find themselves within a unit cell of semiconductor lattice at an adsorption site, and thus the formed oxygen termination layer will have a crystal structure. Typically, the crystalline terminating oxide layer is a few atomic layers thick, for example, up to around substantially 3 nm thick, but can go up to a few hundred atomic layers thick. The surface of the crystalline terminating oxide layer has a symmetry which can be measured with diffraction tools, such as low-energy energy diffraction (LEED).

In embodiments of the present disclosure, the semiconductor regrowth can be facilitated by using a semiconductor heterostructure where one or more crystalline terminating oxide layers are incorporated. The semiconductor material may act as a substrate onto which the crystalline terminating oxide layer is grown epitaxially. The process may be repeated a required number of times as per the design, till the desired semiconductor device is formed. The crystalline terminating oxide layers, as formed, are resistant to air exposure and therefore retain crystallinity even with exposure to ambient air. This can circumvent contemporary known problems of formation of low quality surface after exposure of a compound semiconductor wafer to ambient air pressure.

In an example of semiconductor laser manufacturing, based upon use of III-V semiconductor heterostructures, it is necessary to implement epitaxial layer growth after executing processing. Moreover, example of the processing may include, etching, but are not limited thereto. Furthermore, generated etched surfaces may be typically of lower quality than an initial corresponding surface, due to uneven etching of the surface, residual etchant molecules or oxygen induced disorder. Such disorder and worsened quality of the surface is harmful to semiconductor regrowth. In the present semiconductor device, the terminating oxide layers are optionally used as an etch stop layer. When embodiments of the present disclosure are employed, namely use of a crystalline terminating oxide layer, such layer is beneficial to facilitate subsequent semiconductor regrowth, for example via epitaxial deposition.

DESCRIPTION OF THE DRAWINGS

Referring to FIG. 1, illustrated is a schematic illustration of a semiconductor device 100 having a crystalline terminating oxide layer therein, in accordance with an embodiment of the present disclosure. As shown, the semiconductor device 100 comprises repeating layers, including a base layer 110 having a first side 112 and a second side 114.

The semiconductor device 100 also comprises a crystalline terminating oxide layer 120. The crystalline terminating oxide layer (CTOL) 120 may be formed on at least a part of the first side 112 of the base layer 110. Preferably, the crystalline terminating oxide layer 120 is formed on the whole surface of the first side 112 of the base layer 110.

Additionally, the semiconductor device 100 comprises a quantum well (QW) layer 130. The semiconductor device 100 further comprises the crystalline terminating oxide layer 120 on top of the quantum well layer 130 and subsequently repeating stacks of the base layer 110, the crystalline terminating oxide layer 120, the quantum well layer 130, the second crystalline terminating oxide layer, and so on. In the end, the semiconductor device 100 may, optionally, have a top layer 140 of the base substrate material, which may provide an end surface to attach contacts or the like. It will be appreciated, in some examples, the at least one of the plurality of base layer 110 interfaces via its crystalline terminating oxide layer 120 to a neighbouring epitaxial semiconductor layer thereto.

Figure 2:
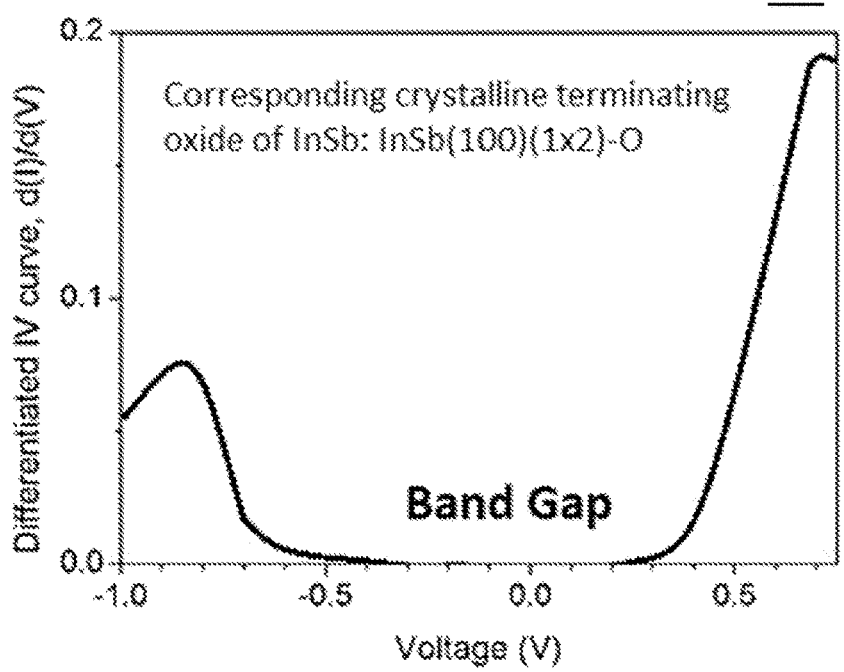
FIG. 2 is an illustration of a plot showing voltage vs. differential IV curve for the semiconductor device, in accordance with an embodiment of the present disclosure.

Referring to FIG. 2, illustrated is a graph 204 representing voltage vs. differential IV curve for the exemplary semiconductor device, in accordance with an embodiment of the present disclosure. The semiconductor device includes the corresponding crystalline terminating oxide layer of InSb, which has a structure of InSb(100)(1×2)-O. As shown, the introduction of the crystalline terminating oxide layer (such as the crystalline terminating oxide layer 120 of FIG. 1) may cause an increase in the energy band gap, in the semiconductor device.

Figure 3:
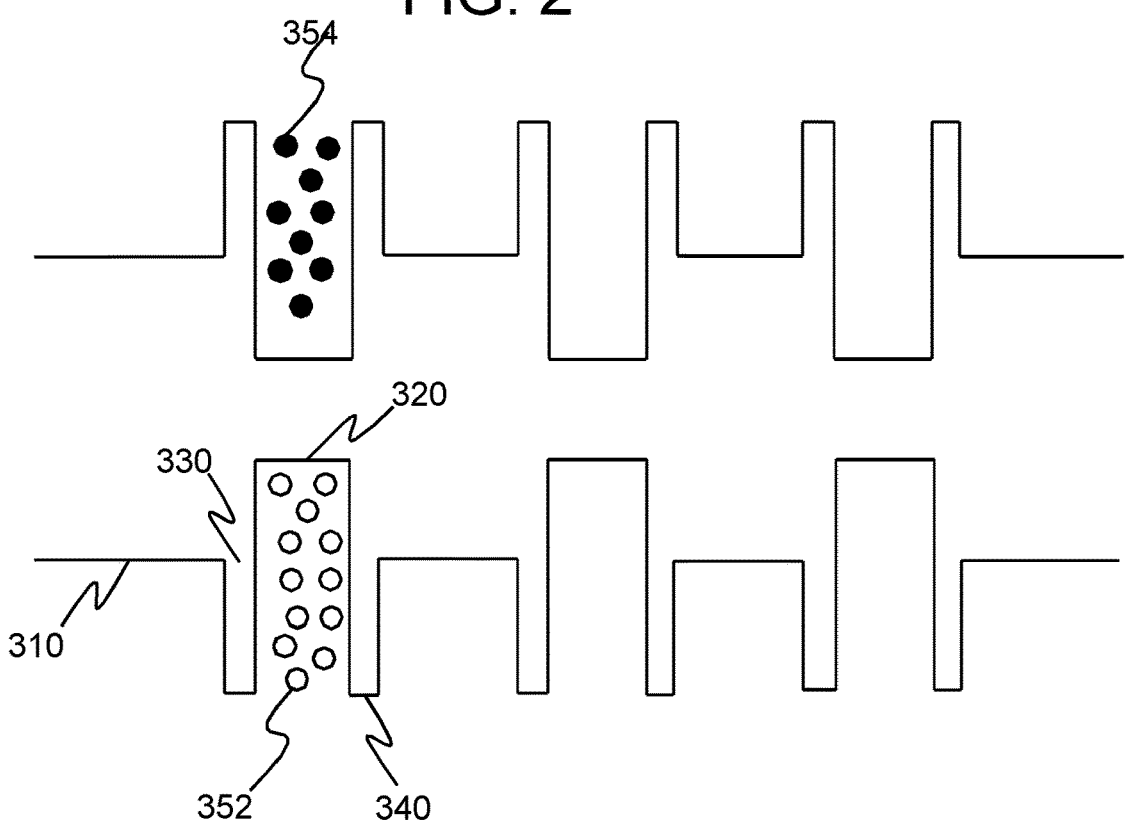
FIG. 3 is a schematic illustration of energy band diagram for the semiconductor device, in accordance with an embodiment of the present disclosure.

Referring to FIG. 3, Illustrated is a schematic illustration of energy band diagram 300 for the semiconductor device 100 with the crystalline terminating oxide layer 120, in accordance with an embodiment of the present disclosure. In the quantum well device structure of FIG. 3, an energy band 310 corresponding to the first semiconductor material, i.e. GaN, is separated from an energy band 320 corresponding to the second semiconductor material, i.e. InGaN by an energy band 330 of crystalline oxide of the first semiconductor material at its first side and an energy band 340 of crystalline oxide of the second semiconductor material at its second side. As shown, the band gap widening in the semiconductor device 100, as discussed above, causes formation of an effective potential barrier for charge carriers, and therefore enables an improved confinement of electrons 354 and holes 352 to be achieved in a given quantum well (QW), and consequently, the problem of aforementioned carrier or electron overflow is reduced.

Figure 4A:
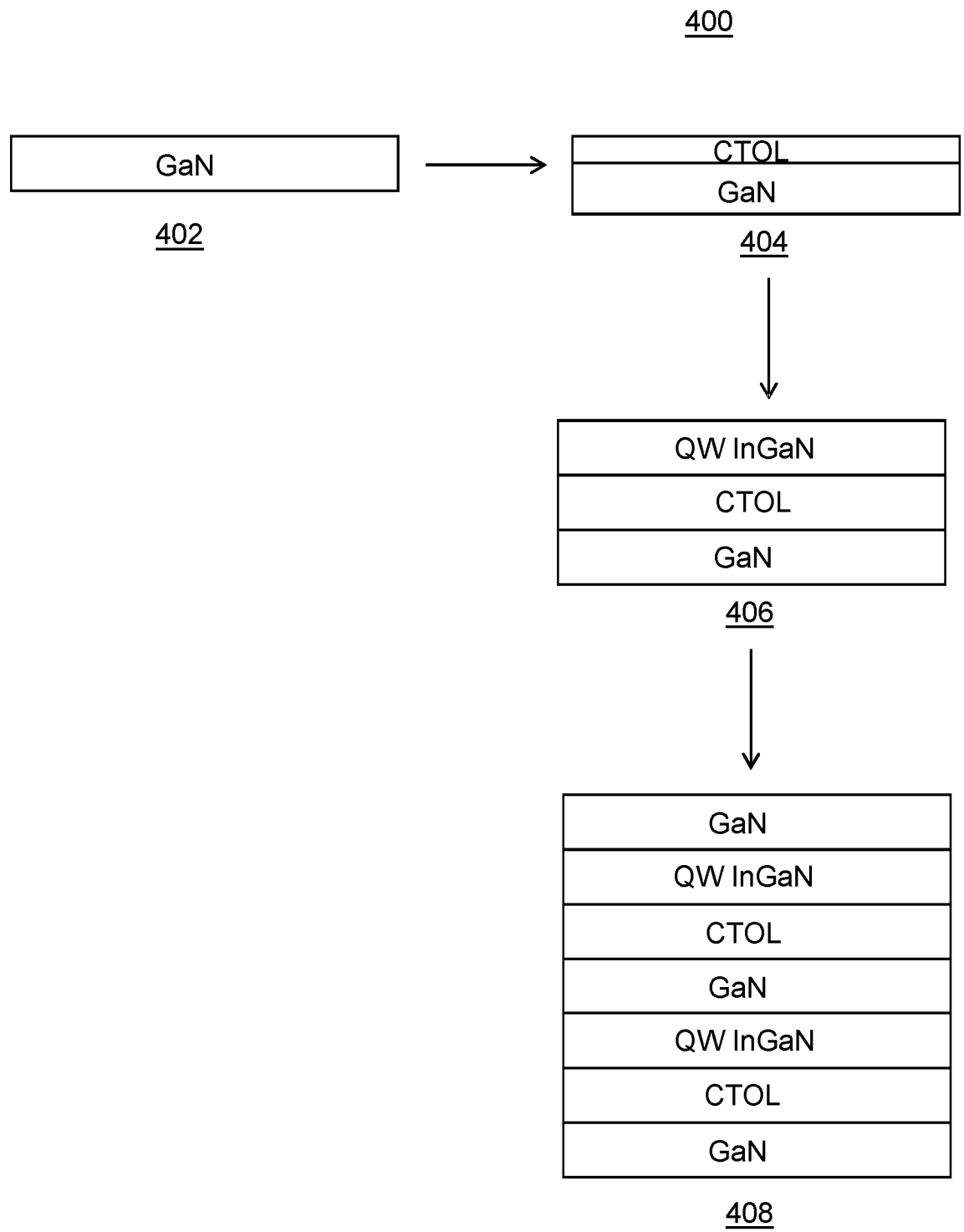
FIG. 4A is an illustration of steps of a method of fabricating the semiconductor device, in accordance with an embodiment of the present disclosure.
Figure 4B:
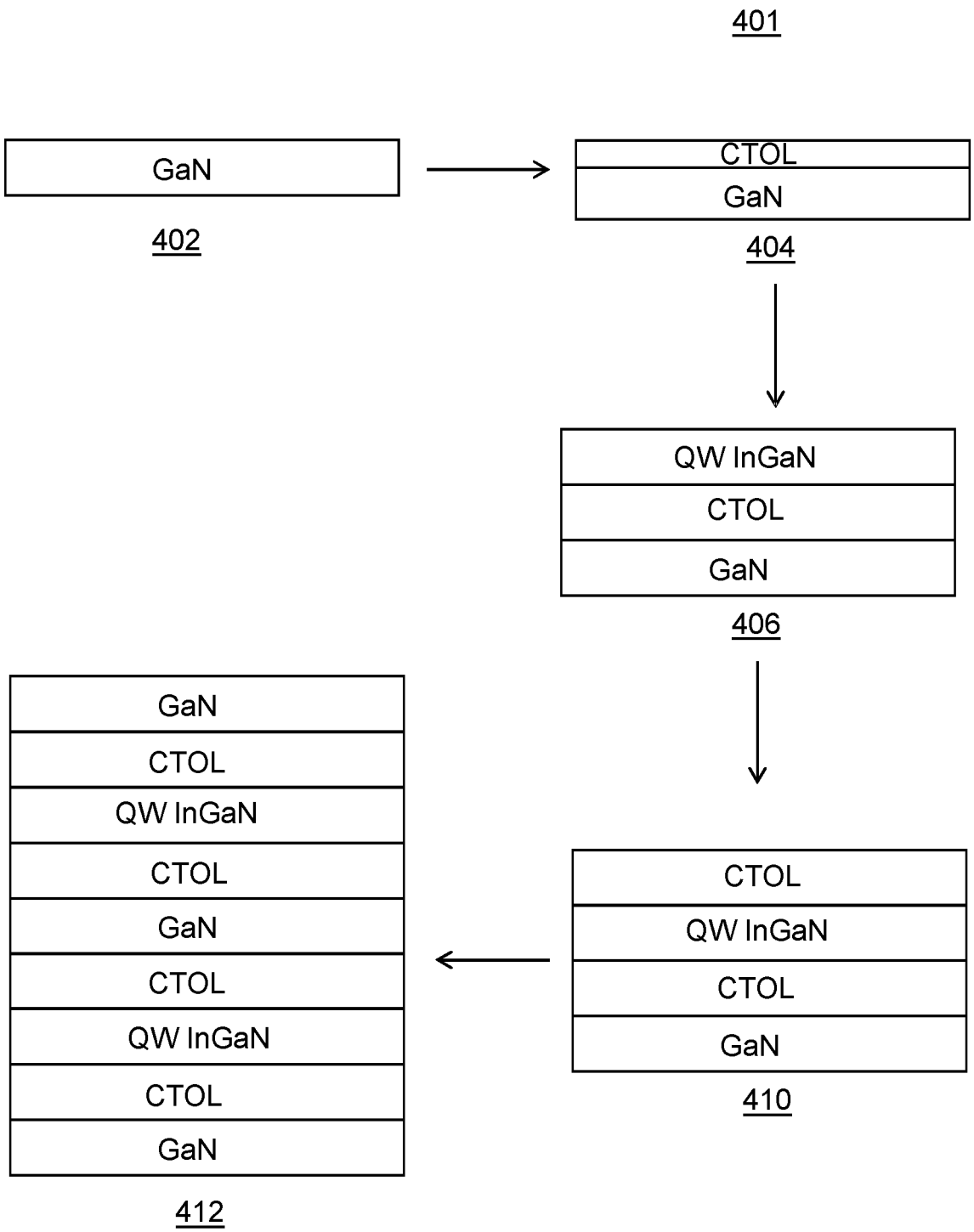
FIG. 4B is an illustration of steps of a method of fabricating the semiconductor device, in accordance with another embodiment of the present disclosure.

Referring to FIG. 4A, illustrated are steps of a method 400 of fabricating a semiconductor device in accordance with an embodiment of the present disclosure. At a step 402, the method 400 involves providing a first semiconductor substrate material of III-V type, which acts as a base layer (such as the base layer 110 of FIG. 1), for the semiconductor device. At a step 404, the method 400 involves transforming the surface of the first semiconductor material to a corresponding crystalline terminating oxide of the first semiconductor material of the base layer. At a step 406, the method 400 involves adding a layer of second semiconductor material layer which may be grown onto the crystalline terminating oxide layer. At a step 408, the aforementioned steps are repeated to form multiple heterostructure layers till a desired assembly of the semiconductor device is achieved as per the design requirements. FIG. 4B illustrates steps of another method 401, wherein steps 402, 404 and 406 are as in FIG. 4A. At step 410, the method involves transforming the surface of the second semiconductor material to a corresponding crystalline terminating oxide of the second semiconductor material layer. At step 412, aforementioned steps are repeated to form multiple heterostructure layers to achieve the desired assembly.

Referring to FIGS. 5A-9B, illustrated are exemplary implementations of the semiconductor device 100 (as shown in FIG. 1), in accordance with various embodiments of the present disclosure. It may be understood by a person skilled in the art that the FIGS. 5A-9B include simplified arrangements for implementation of the semiconductor device 100 for sake of clarity, which should not unduly limit the scope of the claims herein. The person skilled in the art will recognize many variations, alternatives, and modifications of embodiments of the present disclosure.

Figure 5A:
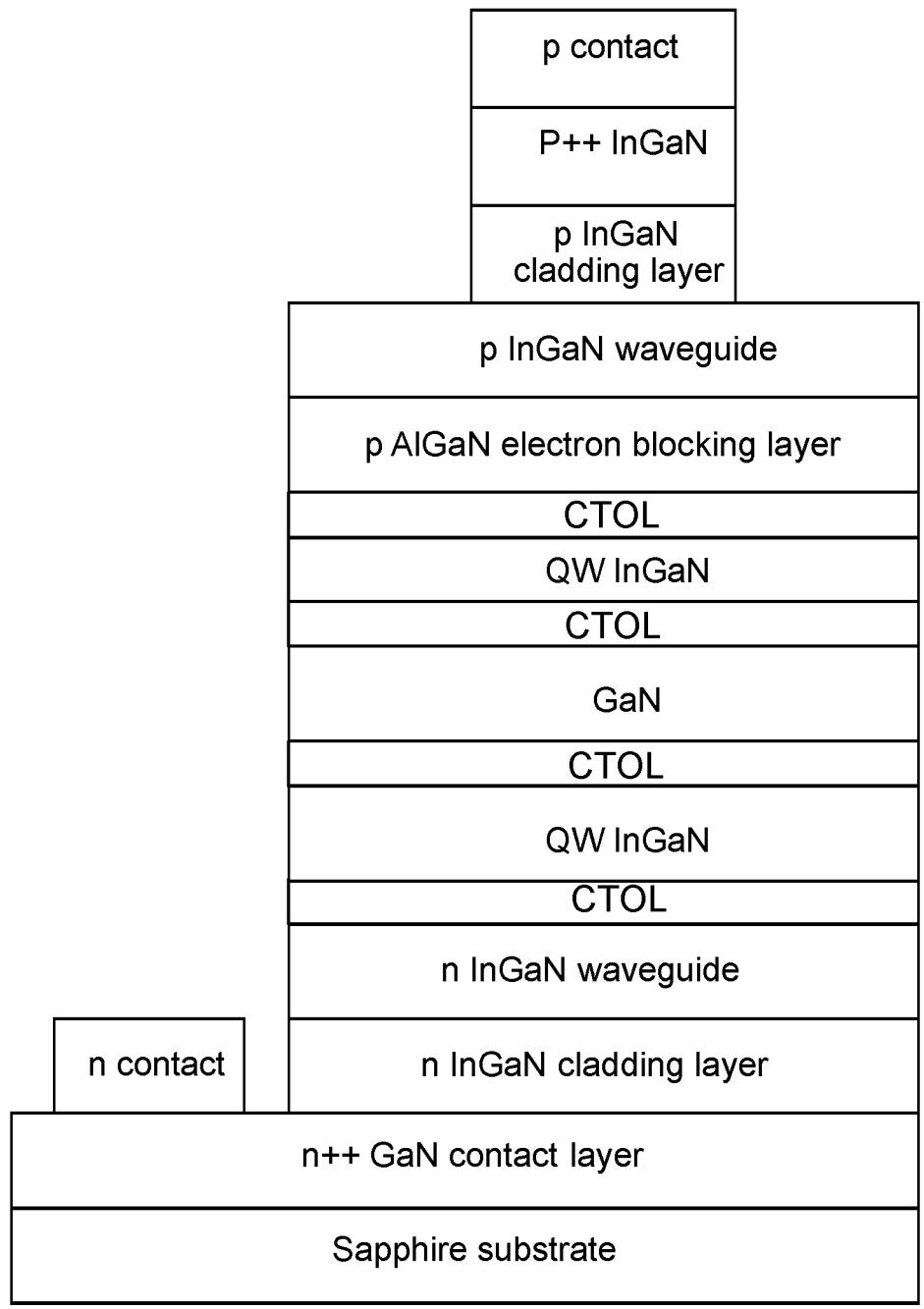
FIGS. 5A-5B are schematic illustrations of a quantum well laser diode stack incorporating the semiconductor device, in accordance with different exemplary embodiments of the present disclosure.
Figure 5B:
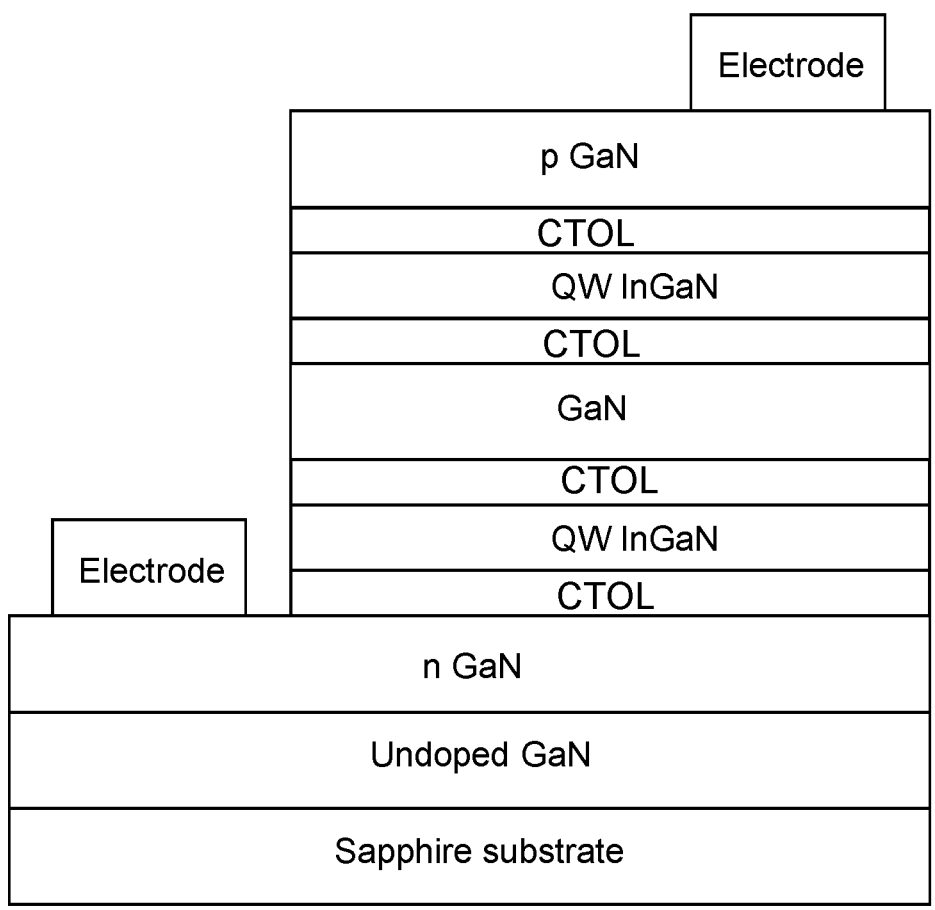
Figure 6:
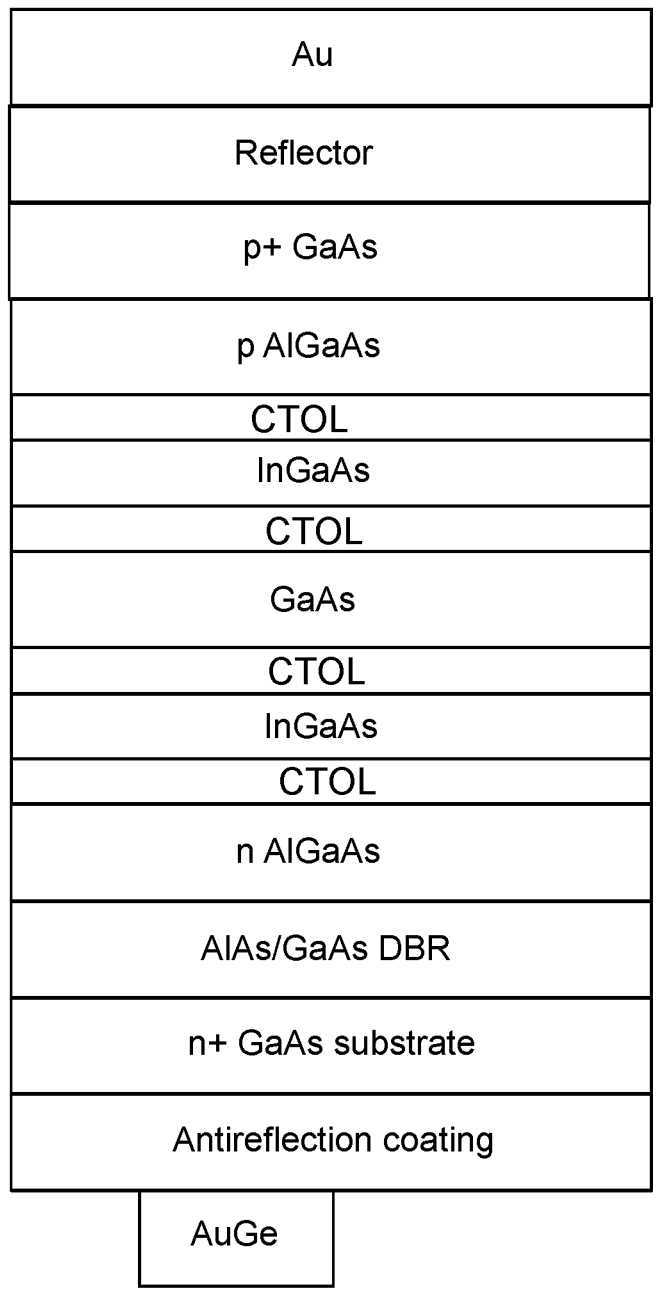
FIG. 6 is a schematic illustration of a resonant cavity light emitting diode (LED) stack incorporating the semiconductor device, in accordance with an exemplary embodiment of the present disclosure.
Figure 7:
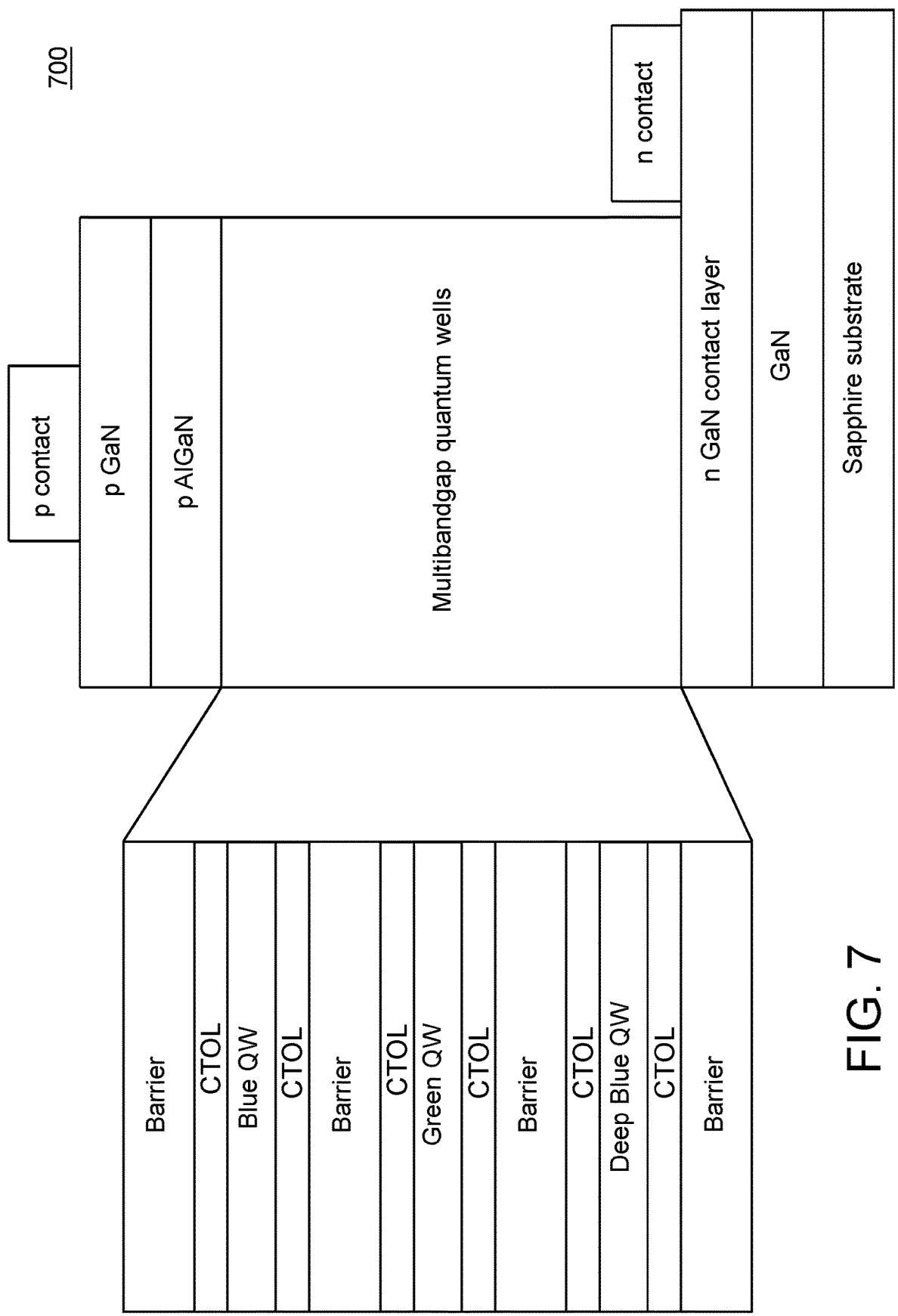
FIG. 7 is a schematic illustration of a quantum well light emitting diode (LED) stack incorporating the semiconductor device, in accordance with an exemplary embodiment of the present disclosure.
Figure 8:
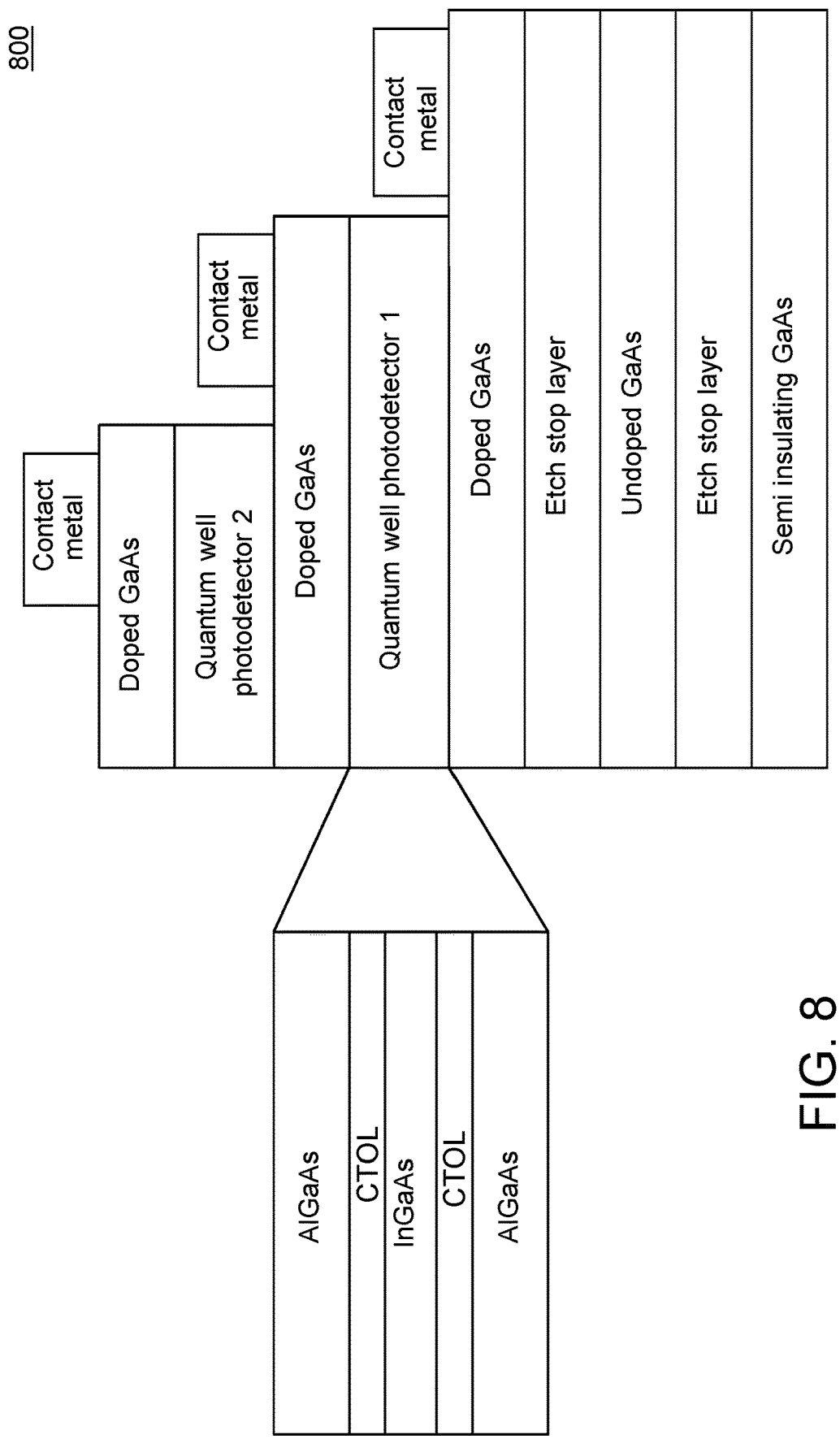
FIG. 8 is a schematic illustration of a quantum well photodetector stack incorporating the semiconductor device, in accordance with an exemplary embodiment of the present disclosure.
Figure 9A:
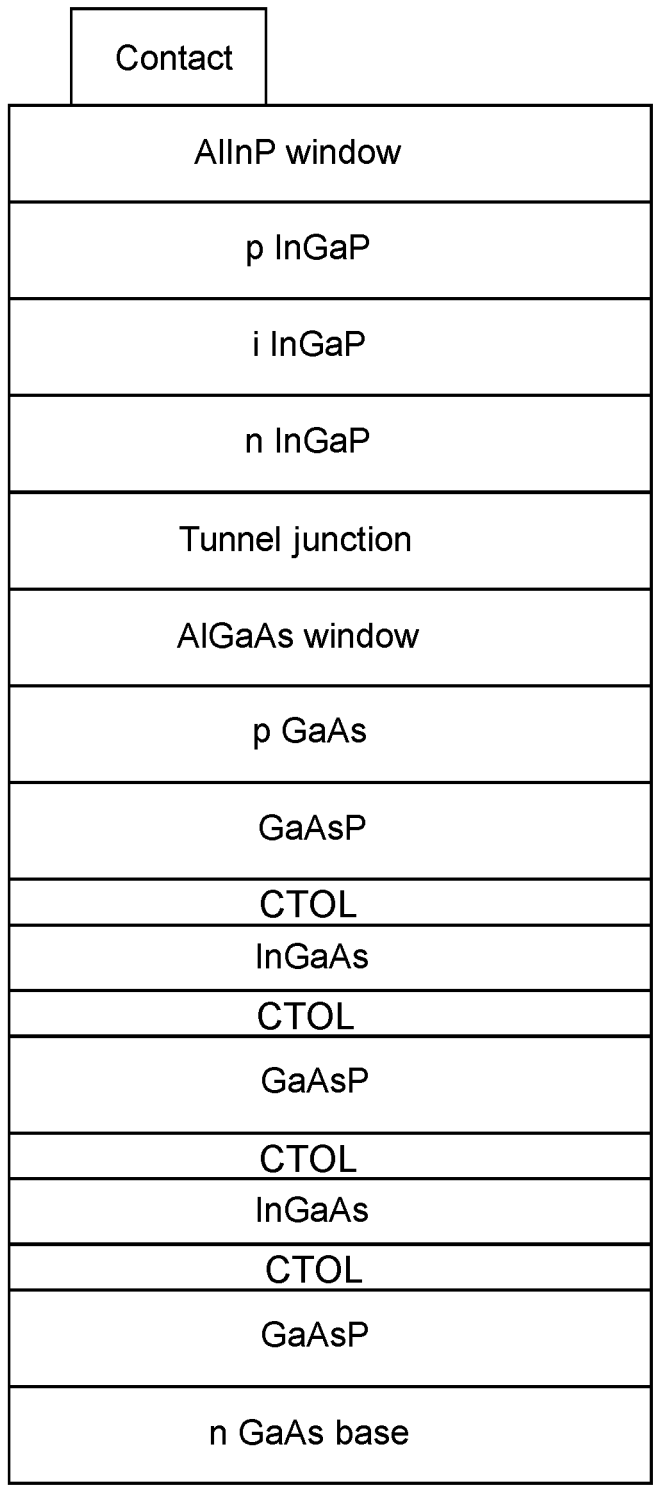
FIGS. 9A-9B are schematic illustrations of a quantum well solar cell stack incorporating the semiconductor device, in accordance with different exemplary embodiments of the present disclosure.
Figure 9B:
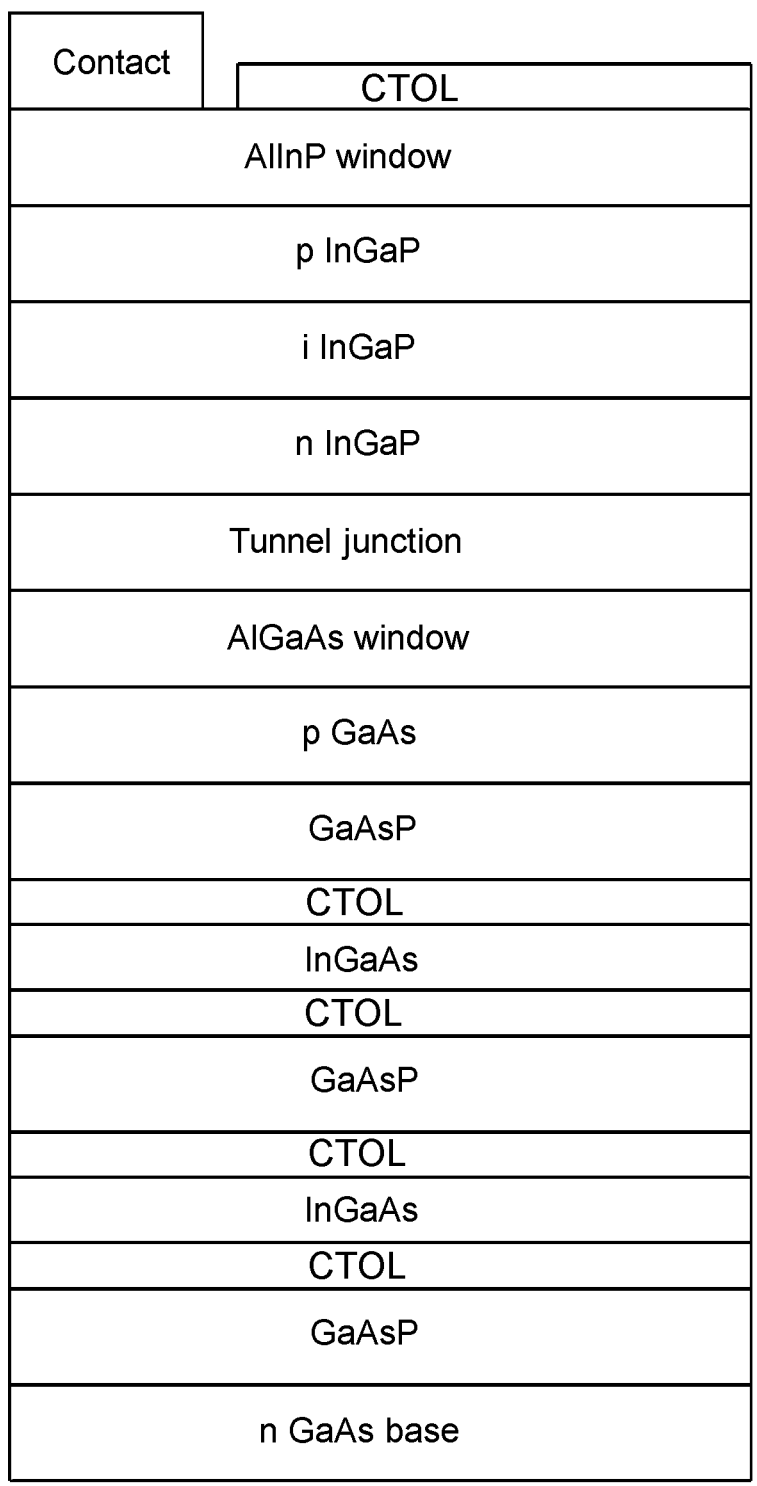

Referring to FIG. 5A, illustrated is a schematic illustration of a quantum well light emitting diode (LED) stack 502 incorporating the semiconductor device 100, in accordance with an exemplary embodiment of the present disclosure. Referring to FIG. 5B, illustrated is a schematic illustration of a quantum well laser diode stack 504 incorporating the semiconductor device 100, in accordance with another exemplary embodiment of the present disclosure. Referring to FIG. 6, illustrated is a schematic illustration of resonant cavity light emitting diode (LED) stack 600 incorporating the semiconductor device 100, in accordance with an exemplary embodiment of the present disclosure. Referring to FIG. 7 illustrated is a schematic illustration of a quantum well light emitting diode (LED) stack 700 incorporating the semiconductor device 100, in accordance with an exemplary embodiment of the present disclosure. The multiband quantum wells provide LED to produce varying colours with much precision. Referring to FIG. 8, illustrated is a schematic illustration of a quantum well photodetector stack 800 incorporating the semiconductor device 100, in accordance with an exemplary embodiment of the present disclosure. Referring next to FIGS. 9A and 9B, illustrated are schematic illustrations of two exemplary configurations of quantum well solar cell stacks 902, 904 incorporating the semiconductor device 300 of the present disclosure. It will be appreciated that in FIGS. 9A and 9B, the GaAsP layers may act as barrier layers, and InGaAs layers may act as quantum well layers. The various substructures as employed in these exemplary configurations of FIGS. 5A and 5B, such as cladding layer, waveguide, contacts, etc. are well known in the art and thus have not been described herein in detail. Moreover, herein, the use of substructures such as distributed Bragg reflector (DBR), anti-reflection coating, etch stop layers, tunnel junctions, etc. in FIGS. 6-9B are well known in the art and thus have not been described herein for the brevity of the disclosure. Furthermore, it will be appreciated by a person skilled in the art that the provided configurations of the semiconductor device 100 are exemplary and various other similar configurations with different applications may be achieved using the teachings of the present disclosure.

Modifications to embodiments of the present disclosure described in the foregoing are possible without departing from the scope of the present disclosure as defined by the accompanying claims. Expressions such as "including", "comprising", "incorporating", "have", "is" used to describe and claim the present disclosure are intended to be construed in a non-exclusive manner, namely allowing for items, components or elements not explicitly described also to be present. Reference to the singular is also to be construed to relate to the plural.

The invention claimed is:

1. A semiconductor device comprising a stacked configuration of a plurality of semiconductor layers, wherein
at least one of the semiconductor layers is a III-V compound semiconductor layer,
at least one of the III-V compound semiconductor layers has formed thereonto a corresponding crystalline terminating oxide layer, wherein the at least one of the plurality of semiconductor layers interfaces via its crystalline terminating oxide layer to a neighbouring epitaxial semiconductor layer thereto;
the semiconductor device is a quantum well device,
wherein the surface symmetry of the crystalline terminating oxide layer is
  (2×3) or (1×1) when the III-V compound semiconductor layer is InP,
  c(4×2) and (3×1) or (3×1) or (3×3) when the III-V compound semiconductor layer is InAs,
  c(4×2), (4×3), (3×1) and (3×2) or (3×1) or (3×3) when the III-V compound semiconductor layer is InGaAs,
  (3√3×3√3–R30°) when the III-V compound semiconductor layer is GaN,
  (1×1) when the III-V compound semiconductor layer is AlGaN or InGaP,
  (1×2) when the III-V compound semiconductor layer is InSb or InGaSb,
  wherein the crystalline terminating oxide layer is implemented as a buried layer within the semiconductor device.

2. A semiconductor device of claim 1, wherein the crystalline terminating oxide layer comprises hydrogen and/or nitrogen.

3. A semiconductor device of claim 1, wherein the crystalline terminating oxide layer is a crystalline compound semiconductor oxide layer.

4. A semiconductor device of claim 1, wherein opposite sides of the quantum well comprise a corresponding crystalline terminating oxide layer.

5. Method of using of a semiconductor device according to claim 1 in a laser diode device stack, a semiconductor light emitting diode stack, a semiconductor photodetector stack or a semiconductor solar cell stack.

6. A method of fabricating a semiconductor quantum well device comprising a stacked configuration of a plurality of semiconductor layers, wherein at least one of the semiconductor layers is a III-V compound semiconductor layer and the plurality of semiconductor layers are operable to accommodate charge carriers, characterized in that the method comprises:
forming onto the at least one III-V compound semiconductor layer a corresponding crystalline terminating oxide layer by absorption of oxygen atoms; and
forming a semiconductor layer directly above the formed crystalline terminating oxide layer,
wherein the surface symmetry of the crystalline terminating oxide layer is
  (2×3) or (1×1) when the III-V compound semiconductor layer is InP,
  c(4×2) and (3×1) or (3×3) when the III-V compound semiconductor layer is InAs,
  c(4×2), (4×3), (3×1) and (3×2) or (3×3) when the III-V compound semiconductor layer is InGaAs,
  (3√3×3√3–R30°) when the III-V compound semiconductor layer is GaN,
  (1×1) when the III-V compound semiconductor layer is AlGaN or InGaP, (1×2) when the III-V compound semiconductor layer is InSb or InGaSb, further comprising implementing the crystalline terminating oxide layer as a buried layer within the semiconductor device.

7. A method of claim 6, wherein forming of the corresponding crystalline terminating oxide layer comprises illuminating the first III-V compound semiconductor surface and/or the oxygen atoms with UV light.

8. A method of claim 7, wherein the UV light has a wavelength shorter than 315 nm.

9. A method of claim 7, wherein the UV light has a wavelength shorter than 280 nm.

10. A method of claim 6, further comprising implementing the semiconductor device as at least one of: a laser diode device stack, a semiconductor light emitting diode stack, a semiconductor photodetector stack, a semiconductor solar cell stack.

11. A method of claim 6, further comprising fabricating the crystalline terminating oxide layer concurrently with fabrication of the neighbouring epitaxial semiconductor layer.

12. A method of claim 6, further comprising fabricating the crystalline terminating oxide layer prior to fabrication of the neighbouring epitaxial semiconductor layer.

13. A method of claim 6, further comprising depositing indium and/or tin atoms onto the first semiconductor layer before absorbing an oxygen flux into a surface of the first semiconductor layer.

14. A method of claim 6, further comprising forming a second corresponding crystalline terminating oxide layer onto a III-V compound semiconductor layer, which III-V compound semiconductor layer has been formed on a previously formed crystalline terminating oxide layer.

15. A computer program product comprising a non-transitory computer-readable storage medium having computer-readable instructions stored thereon, the computer-readable instructions being executable by a computerized device comprising processing hardware to execute a method as claimed in claim 6.

* * * * *